(12) United States Patent
Yu

(10) Patent No.: US 9,515,190 B2
(45) Date of Patent: Dec. 6, 2016

(54) METHOD FOR MANUFACTURING POLYSILICON THIN FILM TRANSISTOR

(71) Applicant: Shenzhen China Star Optoelectronics Technology Co., Ltd., Shenzhen, Guangdong (CN)

(72) Inventor: Xiaojiang Yu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/418,186

(22) PCT Filed: Jan. 19, 2015

(86) PCT No.: PCT/CN2015/070965
§ 371 (c)(1),
(2) Date: May 9, 2016

(87) PCT Pub. No.: WO2016/095308
PCT Pub. Date: Jun. 23, 2016

(65) Prior Publication Data
US 2016/0247936 A1 Aug. 25, 2016

(30) Foreign Application Priority Data
Dec. 19, 2014 (CN) .......................... 2014 1 0796421

(51) Int. Cl.
*H01L 29/786* (2006.01)
*H01L 21/266* (2006.01)
(Continued)

(52) U.S. Cl.
CPC ..... *H01L 29/78609* (2013.01); *H01L 21/0262* (2013.01); *H01L 21/0274* (2013.01);
(Continued)

(58) Field of Classification Search
CPC ........... H01L 21/266; H01L 29/78621; H01L 27/1214; H01L 21/027; H01L 27/10844; H01L 29/4908
See application file for complete search history.

(56) References Cited

U.S. PATENT DOCUMENTS

2002/0083557 A1* 7/2002 Jung .................... H01L 21/2026
23/295 R
2005/0266693 A1* 12/2005 Maekawa .............. B82Y 10/00
438/720

(Continued)

FOREIGN PATENT DOCUMENTS

| CN | 101900947 A | 12/2010 |
| CN | 104064472 A | 9/2014 |
| WO | 2013094555 A1 | 6/2013 |

OTHER PUBLICATIONS

International Search Report and Written opinion, Jan. 19, 2015, China.

*Primary Examiner* — Jaehwan Oh
(74) *Attorney, Agent, or Firm* — Kim Winston LLP

(57) ABSTRACT

A method for manufacturing polysilicon thin film transistor is disclosed, and the method comprises the following steps: forming a semiconductor material layer on a prefabricated substrate; forming an intermediate layer on the semiconductor material layer; forming a photoresist layer on the intermediate layer, and exposing the photoresist layer with a photomask for a first time; moving the prefabricated substrate in a predetermined direction relative to the photomask, and exposing the photoresist layer with the photomask for a second time; forming a photoresist region which comprises a central part and a wing part and a hollowed-out region which contains no photoresist material in the photoresist layer; and forming an ion lightly doped region corresponding to the wing part and an ion heavily doped region corresponding to the hollowed-out region in the semiconductor material layer.

20 Claims, 8 Drawing Sheets

(51) Int. Cl.
| | |
|---|---|
| *H01L 21/02* | (2006.01) |
| *H01L 21/265* | (2006.01) |
| *H01L 21/285* | (2006.01) |
| *H01L 27/12* | (2006.01) |
| *H01L 29/49* | (2006.01) |
| *H01L 29/66* | (2006.01) |
| *H01L 21/027* | (2006.01) |
| *H01L 21/3213* | (2006.01) |
| *H01L 21/3215* | (2006.01) |

(52) U.S. Cl.
CPC ....... *H01L21/02675* (2013.01); *H01L 21/266* (2013.01); *H01L 21/26513* (2013.01); *H01L 21/2855* (2013.01); *H01L 21/32139* (2013.01); *H01L 21/32155* (2013.01); *H01L 27/1222* (2013.01); *H01L 27/1285* (2013.01); *H01L 29/4908* (2013.01); *H01L 29/66757* (2013.01); *H01L 29/66765* (2013.01); *H01L 29/78621* (2013.01); *H01L 29/78633* (2013.01); *H01L 29/78675* (2013.01); *H01L 29/78678* (2013.01)

(56) References Cited

U.S. PATENT DOCUMENTS

| | | | |
|---|---|---|---|
| 2006/0063343 A1* | 3/2006 | Chang | H01L 29/78621 438/369 |
| 2010/0210078 A1* | 8/2010 | Miyairi | H01L 21/76254 438/155 |
| 2011/0256698 A1* | 10/2011 | Riordon | H01J 37/3172 438/529 |
| 2013/0207163 A1* | 8/2013 | Chen | H01L 21/823437 257/202 |
| 2016/0181437 A1* | 6/2016 | Bu | H01L 21/28 257/66 |

* cited by examiner

METHOD FOR MANUFACTURING POLYSILICON THIN FILM TRANSISTOR

CROSS REFERENCE TO RELATED APPLICATION

The present application claims benefit of Chinese patent application CN 201410796421.X, entitled "Method for Manufacturing Polysilicon Thin Film Transistor" and filed on Dec. 19, 2014, which is incorporated herein by reference.

FIELD OF THE INVENTION

The present disclosure relates to the technical field of production of thin film transistor, and particularly to a method for manufacturing polysilicon thin film transistor.

BACKGROUND OF THE INVENTION

In recent years, Low Temperature Poly-Silicon (LTPS) panels are widely used in high-end mobile phones and tablet personal computers. The thin film transistors which are used in the LTPS panel are made of Low Temperature Poly-Silicon with high mobility ratio. This kind of panel has the advantages of high resolution, low power consumption, as well as high response speed and aperture ratio, and may hopefully become the mainstream small and medium sized display panel of next generation.

In the LTPS panel, the charge/discharge control elements of pixels, the electrostatic discharging elements, the divider elements, and the driving elements of the gates which are arranged on an array substrate are all made of thin film transistors. However, the electric leakage of traditional LTPS thin film transistor is high, and Lightly Doped Drain (LDD) regions need to be made at a drain and a source of the LTPS thin film transistor to reduce the electric leakage thereof. In this case, the leak current can be reduced by the LDD regions each with a low doping and a high resistance.

During the traditional process for manufacturing the LTPS panel, a plurality of photomasks are generally needed to form the LDD regions, and consequently, the manufacturing procedures and costs of the panel are both increased.

SUMMARY OF THE INVENTION

In order to solve the aforesaid technical problem, the present disclosure provides a simplified method for manufacturing polysilicon thin film transistor, whereby the manufacturing procedures and costs of the panel can both be reduced.

According to one embodiment of the present disclosure, the present disclosure provides a method for manufacturing polysilicon thin film transistor, comprising the following steps: forming a semiconductor material layer on a prefabricated substrate; forming an intermediate layer on said semiconductor material layer; coating said intermediate layer with a photoresist material to form a photoresist layer, and exposing said photoresist layer with a photomask for a first time; moving the prefabricated substrate which has the photoresist layer treated by a first exposing treatment in a predetermined direction relative to said photomask, and exposing said photoresist layer with said photomask for a second time; removing an exposed photoresist material from said photoresist layer, so as to form a photoresist region and a hollowed-out region on said photoresist layer, wherein said photoresist region comprises a central part and a wing part, and said hollowed-out region contains no photoresist material; and forming an ion lightly doped region corresponding to said wing part and an ion heavily doped region corresponding to said hollowed-out region in said semiconductor material layer, said ion heavily doped region being used for forming a source and a drain.

According to one embodiment of the present disclosure, said photomask comprises an opaque region and a non-opaque region.

According to one embodiment of the present disclosure, when said prefabricated substrate is moved in the predetermined direction, said predetermined direction and a moving distance are selected in combination with each other so that the opaque region of said photomask covers a first part of an exposed region of said photoresist layer and a second part of an unexposed region of said photoresist layer.

According to one embodiment of the present disclosure, said first part has the same width as the ion lightly doped region to be formed.

According to one embodiment of the present disclosure, the central part of said photoresist region is formed by a part of the photoresist layer suffering no exposure during two times of exposing treatment, and the wing part of said photoresist region is formed by a part of the photoresist layer which is exposed only once during two times of exposing treatment.

According to one embodiment of the present disclosure, said prefabricated substrate comprises a gate metal layer and a gate insulation layer that is arranged on said gate metal layer, and said intermediate layer is an interlayer insulation layer.

According to one embodiment of the present disclosure, said intermediate layer comprises a gate insulation layer and a gate metal layer that is arranged on said gate insulation layer and used for forming a gate.

According to one embodiment of the present disclosure, the steps of forming said ion lightly doped region and said ion heavily doped region comprise: removing a metal material of said gate metal layer corresponding to said hollowed-out region; implanting ions of high concentration so as to form said ion heavily doped region corresponding to said hollowed-out region in said semiconductor material layer; removing the wing part of said photoresist region, so that said gate metal layer is bare; etching away a bare region of the gate metal layer; and implanting ions of low concentration so as to form said ion lightly doped region corresponding to a removed wing part in said semiconductor material layer.

According to one embodiment of the present disclosure, the method further comprising forming a buffer layer on said prefabricated substrate before said semiconductor material layer is formed.

According to one embodiment of the present disclosure, the method further comprising forming a light shielding layer on said prefabricated substrate corresponding to said semiconductor material layer before said buffer layer is formed.

According to the present disclosure, when the LTPS panel is manufactured, the manufacturing procedures and costs thereof can both be reduced.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings:

FIG. 2b is a top view of FIG. 2a;

FIG. 4b is a top view of FIG. 4a;

FIG. 6b is a top view of FIG. 6a;

FIG. 7b is a top view of FIG. 7a;

FIG. 9b is a top view of FIG. 9a;

FIG. 10b is a top view of FIG. 10a;

FIG. 12b is a top view of FIG. 12a; and

DETAILED DESCRIPTION OF THE EMBODIMENTS

The present disclosure will be illustrated in detail hereinafter in combination with the accompanying drawings to make the purpose, technical solutions, and advantages of the present disclosure more clear.

Figure 1:
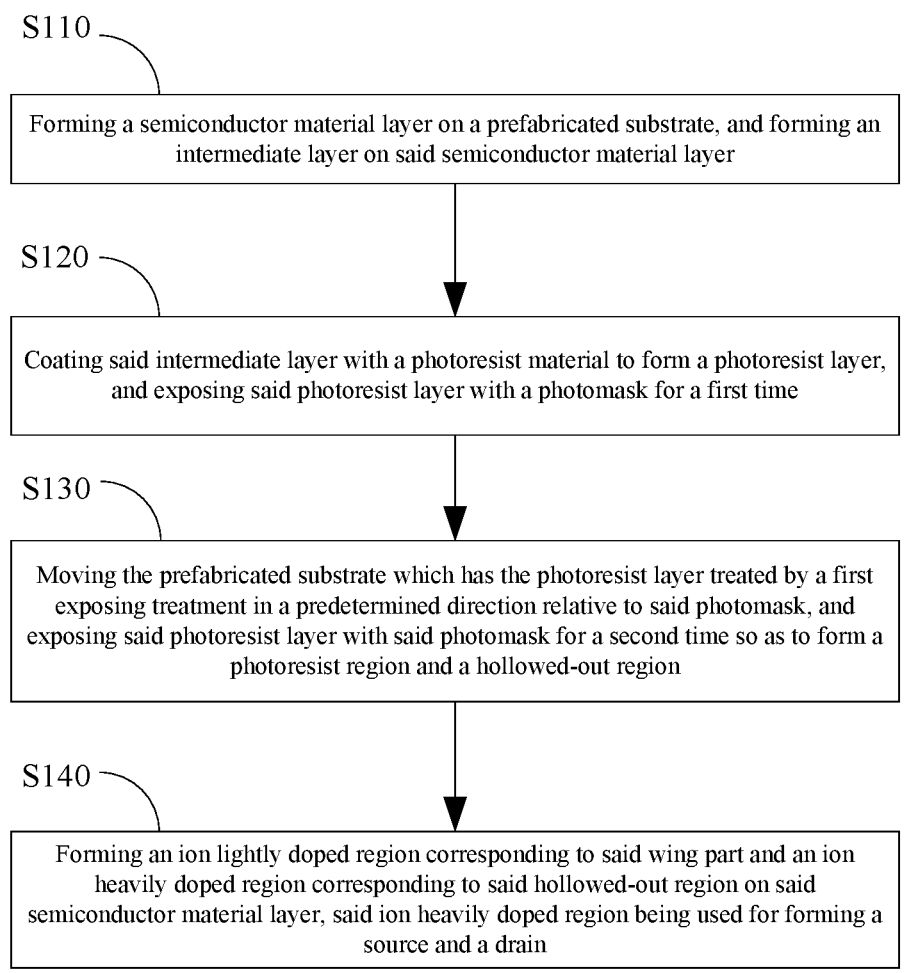
FIG. 1 is a flow chart according to one embodiment of the present disclosure.

FIG. 1 is a flow chart according to one embodiment of the present disclosure. The method according to the present disclosure will be illustrated in detail below with reference to FIG. 1. In the context, when polysilicon thin film transistor is manufactured, both high temperature polysilicon and low temperature polysilicon can be used. The method according to the present disclosure will be illustrated taking the manufacturing of low temperature polysilicon as an example.

In step S110, a semiconductor material layer is formed on a prefabricated substrate, and an intermediate layer is formed on said semiconductor material layer.

Here, the semiconductor material layer is used for forming a low temperature polysilicon layer, which is arranged on the prefabricated substrate as silicon islands. Since there are bottom-gate structure polysilicon thin film transistors and top-gate structure polysilicon thin film transistors, the prefabricated substrate which are used for forming the semiconductor material layer can have different structures.

In the bottom-gate structure polysilicon thin film transistor, the prefabricated substrate comprises a gate metal layer that is formed on a baseplate, and the gate metal layer is used for forming a gate. The prefabricated substrate further comprises a gate insulation layer that is deposited on said gate metal layer. In the bottom-gate structure polysilicon thin film transistor, the intermediate layer is an interlayer insulation layer, which is used for separating the semiconductor material layer from other material layers that are formed after the semiconductor material layer.

In the top-gate structure polysilicon thin film transistor, the prefabricated substrate is a baseplate, and generally a glass baseplate, and the intermediate layer of the top-gate structure polysilicon thin film transistor comprises a gate insulation layer and a gate metal layer that is arranged on said gate insulation layer and used for forming a gate.

According to the present disclosure, the method will be illustrated taking the manufacturing of a top-gate structure polysilicon thin film transistor as an example, but the present disclosure is not limited by this.

In this step, when the top-gate structure polysilicon thin film transistor is manufactured, first, an intrinsic amorphous silicon layer is deposited on the baseplate through Plasma Enhanced Chemical Vapor Deposition (PECVD) method. Then, the amorphous silicon layer is dehydrogenated. After that, the semiconductor material layer is formed through Excimer Laser Annealing (ELA), Successive Lateral Crystallization (SLC), or other techniques. The semiconductor material layer is a low temperature polysilicon layer, which is arranged as silicon islands, and each silicon island is a low temperature polysilicon island.

Figure 2A:
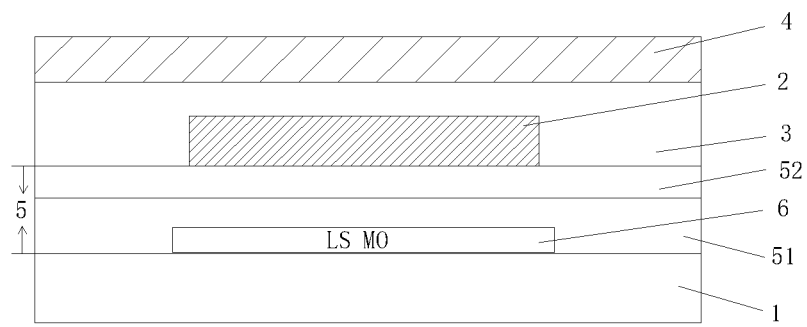
FIG. 2a is a sectional view of a substrate after a gate metal layer is formed according to the embodiment of the present disclosure.

Next, silicon oxide or silicon nitride is deposited on the low temperature polysilicon layer through PECVD method to form a gate insulation layer. As shown in FIG. 2a, the low temperature polysilicon layer is deposited on a baseplate 1, and the polysilicon of the low temperature polysilicon layer forms low temperature polysilicon islands 2. A gate insulation layer 3 is deposited on the low temperature polysilicon layer, and can be constituted by a single layer of silicon oxide, or a layer of silicon oxide and a layer of silicon nitride that is arranged on the layer of silicon oxide.

In the following, molybdenum or other metals is deposited on the gate insulation layer 3 through sputtering, so as to form a gate metal layer 4.

In step S110, a buffer layer 5 is generally deposited on the baseplate 1, and a low temperature polysilicon island 2 is formed on the buffer layer 5. The buffer layer 5 generally comprises a layer of silicon nitride and a layer of silicon oxide. With the buffer layer 5, the influence brought about by the defects of the baseplate 1 can be eliminated, and the impurities of the baseplate 1, such as metal ions, can be prevented from diffusing and permeating into the polysilicon island 2, whereby the disqualification of components which would be generated otherwise can be avoided. In general, a light shielding layer 6 is arranged on the baseplate 1 at a position corresponding to the low temperature polysilicon island 2 to be formed therein before the buffer layer 5 is formed in order to shield the light thereof. In this manner, the low temperature polysilicon thin film transistor to be formed therein can be avoided from light irradiation.

Figure 2B:
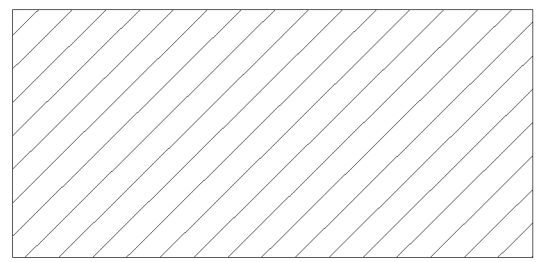

FIG. 2a is a sectional view of the substrate after the treatment of step S110. As shown in FIG. 2a, the baseplate 1 is provided with the light shielding layer 6. The buffer layer 5 is deposited on the light shielding layer 6 and the bare region of the baseplate 1, and comprises a silicon nitride layer 51 and a silicon oxide layer 52. The low temperature polysilicon island 2 corresponding to the light shielding layer 6 is deposited on the buffer layer 5. The gate insulation layer 3 is deposited on the low temperature polysilicon island 2 and the bare region of the buffer layer 5. And the gate metal layer 4 is deposited on the gate insulation layer 3. FIG. 2b is a top view of FIG. 2a, the surface thereof being the gate metal layer 4.

In step S120, the intermediate layer is coated with a photoresist material to form a photoresist layer, and the photoresist layer is exposed with a photomask for a first time.

Figure 3:
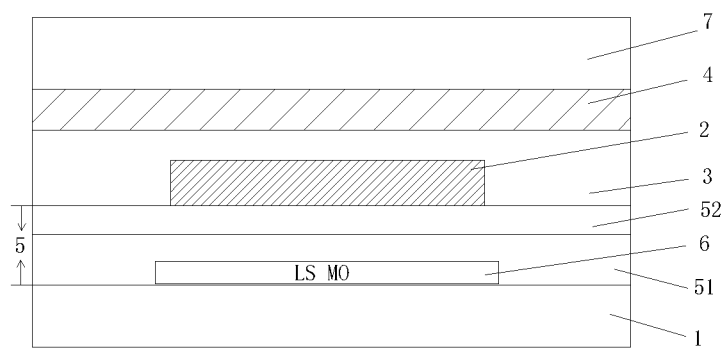
FIG. 3 is a sectional view of the substrate as shown in FIG. 2a after being coated with a photoresist material.

In this step, the gate metal layer 4 is firstly coated with a photoresist material to form a photoresist layer, and then the photoresist layer is exposed for the first time. FIG. 3 is a sectional view of the substrate after the gate metal layer 4 is coated with a photoresist material and the photoresist layer 7 is formed.

Figure 4A:
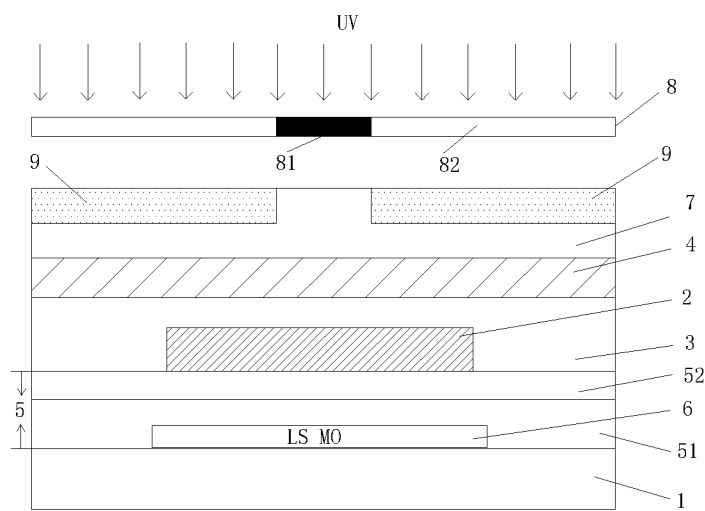
FIG. 4a is a sectional view of the substrate as shown in FIG. 3 when being exposed for a first time.
Figure 4B:
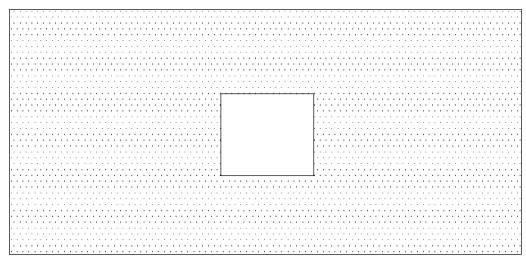

The photomask 8 used here comprises an opaque region 81 and a non-opaque region 82, as shown in FIG. 4a. The properties of the photoresist material with a certain thickness can be changed by vacuum ultraviolet through controlling an intensity and exposure time thereof, as shown by a region 9 in FIG. 4a. FIG. 4b is a top view of FIG. 4a. As shown in FIG. 4b, a region inside the box is an unexposed region of the photoresist layer 7 corresponding to the opaque region 81 of the photomask 8 after the photoresist material is exposed for the first time. The properties of the photoresist material in the unexposed region are not changed by the vacuum ultraviolet, while the properties of the photoresist material outside the box are changed by the vacuum ultraviolet.

In step S130, the prefabricated substrate which has the photoresist layer after a first exposing treatment is moved in a predetermined direction relative to the photomask, and said photoresist layer is exposed with said photomask for a second time, so that a photoresist region and a hollowed-out region can be formed.

Figure 5A:
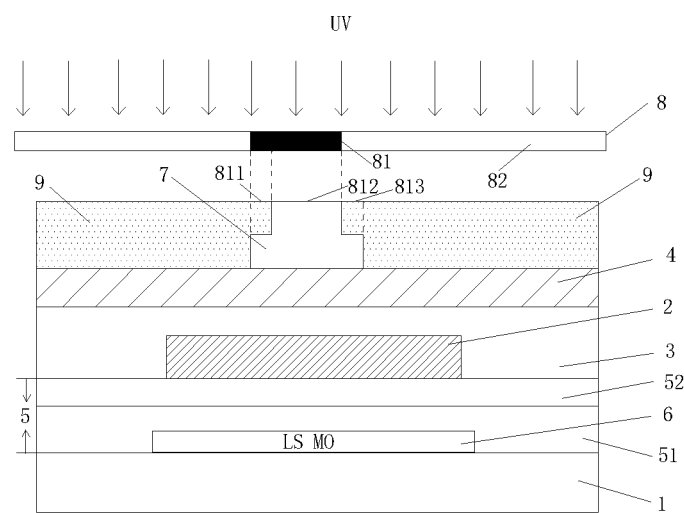
FIG. 5a is a sectional view of the substrate as shown in FIG. 4a when being exposed for a second time.

Here, the substrate is moved in a predetermined direction through moving a workbench of an exposure machine which carries the prefabricated substrate, while the photomask is kept stationary. When said prefabricated substrate is moved in the predetermined direction, said predetermined direction and a moving distance are selected in combination with each other so that the opaque region of said photomask covers a first part 811 of an exposed region of said photoresist layer and a second part 812 of an unexposed region of said photoresist layer, as shown in FIG. 5a. Said first part 811 has the same width as the ion lightly doped region to be formed therein, and the first parts 811 and 813, which are located at two sides of the second part 812 respectively, have the same width.

When the predetermined direction is to be determined, an edge of the baseplate 1 is generally selected as a reference edge. The baseplate 1 is moved in a direction which forms a certain angle with the reference edge, so that the unexposed region of the baseplate formed by the opaque region 81 of the photomask 8 during the first exposing treatment overlaps partly with the unexposed region of the baseplate formed therein during the second exposing treatment. The overlapped part forms the second part 812 of the photoresist layer 7.

Figure 5B:
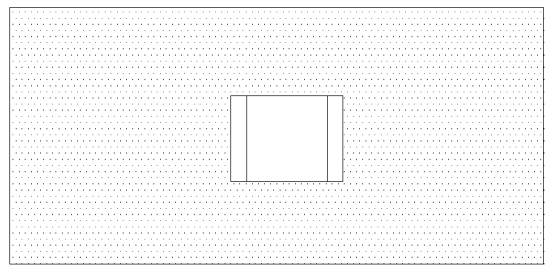
FIG. 5b is a top view of the substrate as shown in FIG. 5a when being exposed for a second time after horizontal movement.

When the baseplate 1 is moved in a direction which forms a certain angle with the reference edge, the certain angle includes all possible angles as long as the baseplate 1 can be moved accordingly. For example, a longer edge of the baseplate 1 as shown in FIG. 5a can be taken as the reference edge, and the baseplate 1 is moved in a horizontal direction. In this case, the unexposed region of the baseplate 1 during the first exposing treatment overlaps partly with the unexposed region thereof during the second exposing treatment, whereby an overlapped region, i.e., the second part 812 can be formed. At the same time, two non-overlapped regions of the unexposed region during the first exposing treatment and the unexposed region during the second exposing treatment which is to be performed next are formed respectively at the two opposite sides along the horizontal direction of the overlapped region. The two non-overlapped regions, i.e., the regions which are exposed only once during the two exposing treatments, are the same with each other, as shown in FIG. 5b.

Figure 5C:
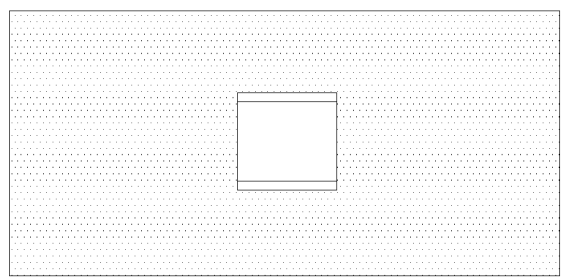
FIG. 5c is a top view of the substrate as shown in FIG. 5a when being exposed for a second time after vertical movement.

The baseplate 1 can also be moved in a direction perpendicular to the reference edge. In this case, the unexposed region of the baseplate 1 during the first exposing treatment overlaps partly with the unexposed region during the second exposing treatment which is to be performed next, whereby the second part 812 can be formed. At the same time, two non-overlapped regions of the unexposed region during the first exposing treatment and the unexposed region during the second exposing treatment are formed respectively at the two opposite sides along the vertical direction of the overlapped region. The two non-overlapped regions, i.e., the regions which are exposed only once during the two exposing treatments, are the same with each other, as shown in FIG. 5c.

Figure 5D:
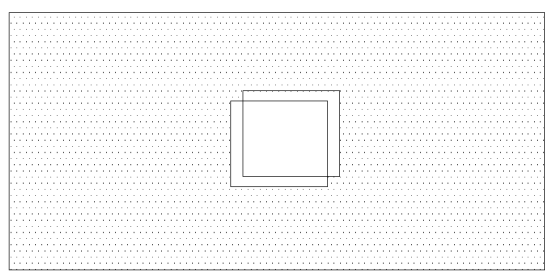
FIG. 5d is a top view of the substrate as shown in FIG. 5a when being exposed for a second time after movement in a direction which forms a certain angle with a horizontal direction.

According to a specific embodiment of the present disclosure, in addition to the direction parallel to the reference edge and the direction perpendicular to the reference edge, the baseplate 1 can also be moved in a direction which forms a certain angle with the reference edge. In this case, the unexposed region during the first exposing treatment overlaps partly with the unexposed region during the second exposing treatment. At the same time, four non-overlapped regions of the unexposed region during the first exposing treatment and the unexposed region during the second exposing treatment are formed at the two opposite sides along the horizontal direction of the overlapped region and the two opposite sides along the vertical direction of the overlapped region respectively, as shown in FIG. 5d, wherein the widths of the two non-overlapped regions formed at the two opposite sides along the horizontal direction of the overlapped region are equal to each other, and the widths of the two non-overlapped regions formed at the two opposite sides along the vertical direction of the overlapped region are equal to each other. In general, the certain angle here can be any angle selected from a range of 30° to 60°, while the angle is not limited by the above range. When the angle is selected to be 45°, the widths of the four non-overlapped regions are equal to each other.

The moving distance of the baseplate 1 is determined by a width of the ion lightly doped region to be formed therein. When the baseplate is moved in the predetermined direction, a width of the non-overlapped region of the unexposed region during the first exposing treatment and the unexposed region during the second exposing treatment should be equal to the width of the ion lightly doped region to be formed therein. When the baseplate 1 is moved in the predetermined direction as shown in FIG. 5b or FIG. 5c, it can be determined that the moving distance of the baseplate 1, i.e., the width of the first part 811, is equal to the width of the ion lightly doped region to be formed therein.

When the baseplate 1 is moved in the predetermined direction as shown in FIG. 5d, the moving distance of the baseplate 1 should be determined by the predetermined direction and the width of the ion lightly doped region to be formed therein together. In this case, four non-overlapped regions are formed after two exposing treatments, wherein the widths of the two opposite non-overlapped regions can be equal to each other, and the widths of the two adjacent non-overlapped regions can be equal to or unequal to each other. If the widths of the two adjacent non-overlapped regions are equal to each other, either of the two opposite non-overlapped regions can be selected to correspond to the ion lightly doped region to be formed therein. In this case, the thin film transistors can be arranged on the baseplate in two modes. Preferably, when the angle is selected to be 45°, the widths of the four non-overlapped regions are equal to each other, and either of the two opposite non-overlapped regions can be selected to correspond to the ion lightly doped region to be formed therein. When the angle is not 45°, the widths of the two adjacent non-overlapped regions are unequal to each other, the two opposite non-overlapped regions can be selected according to an arrangement mode of the ion lightly doped region to be formed therein, and the moving distance of the baseplate 1 can be determined accordingly. The moving distance of the baseplate 1 can be selected from a range of 1 μm to 5 μm and should not larger than a distance among the thin film transistors to be formed therein.

Figure 6A:
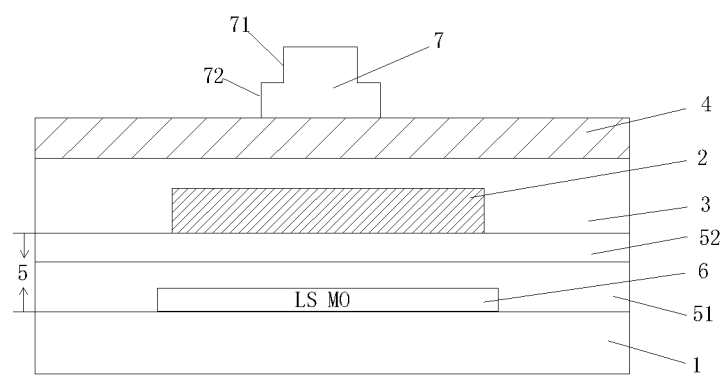
FIG. 6a is a sectional view of the substrate as shown in FIG. 5d after an exposed photoresist material is removed therefrom.
Figure 6B:
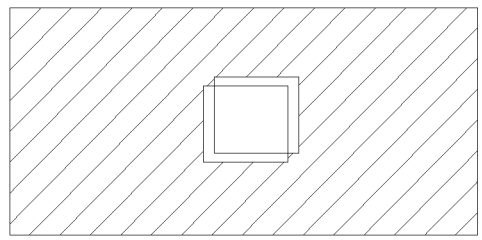

The present disclosure will be illustrated below taking the baseplate 1 being moved in the direction forming an angle selected from a range of 30° to 60° with the reference edge as an example. The properties of the photoresist material with a certain thickness can be changed by vacuum ultraviolet through controlling an intensity and exposure time of the second exposing treatment. As shown in FIG. 5a, after the second exposing treatment, the photoresist material on the gate metal layer 4 is changed into two parts, i.e., the photoresist layer 7 whose properties are not changed by vacuum ultraviolet and a photoresist layer 9 whose properties are changed by vacuum ultraviolet. The photoresist layer 7 forms a photoresist region with photoresist material of different thicknesses. The photoresist region comprises a central part 71 with a first thickness, which is not exposed during the two exposing treatments. With respect to the region which is exposed only once during the two exposing treatments, the properties of the photoresist material at an upper layer are changed by vacuum ultraviolet while the properties of the photoresist material at a lower layer are not changed by vacuum ultraviolet, and the region forms a wing part 72 of the photoresist region with a second thickness. The first thickness is larger than the second thickness. The sectional view of the baseplate after the exposed photoresist material is removed is shown in FIG. 6a, wherein the region outside the photoresist region where the intermediate layer (i.e., the gate metal layer 4) is bare forms a hollowed-out region. The top view of FIG. 6a is shown in FIG. 6b.

In step S140, an ion lightly doped region corresponding to said wing part and an ion heavily doped region corresponding to the hollowed-out region are formed on said semiconductor material layer, said ion heavily doped region being used for forming a source and a drain.

Figure 7A:
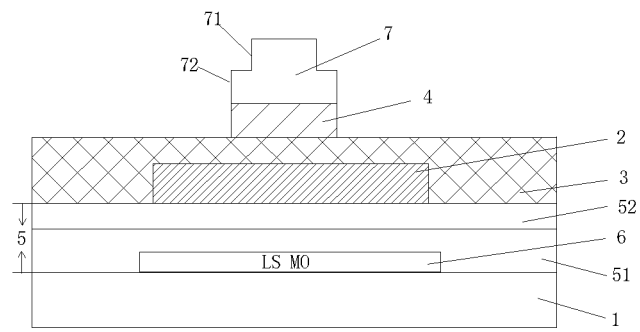
FIG. 7a is a sectional view of the substrate as shown in FIG. 6a after a gate metal layer that is not covered by the photoresist layer is removed therefrom.
Figure 7B:
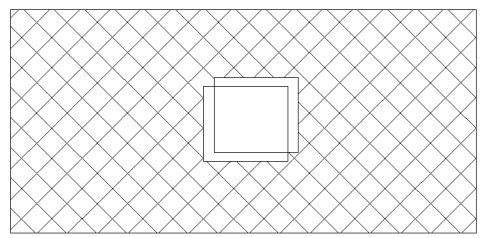

In this step, the metal material of the gate metal layer corresponding to the hollowed-out region is first removed. The substrate after the metal material is removed is shown in FIG. 7a. The top view of FIG. 7a is shown in FIG. 7b.

Figure 8:
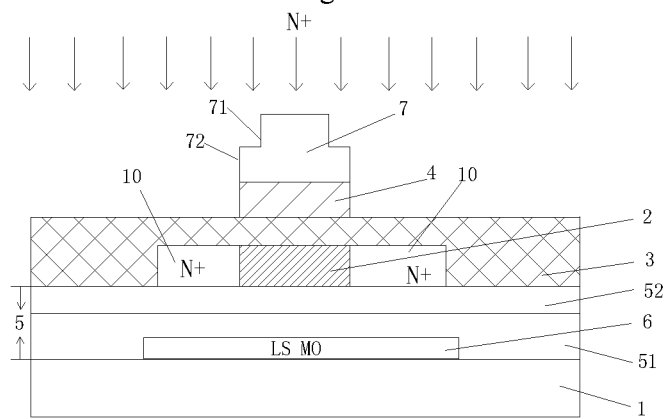
FIG. 8 is a sectional view of the substrate as shown in FIG. 7a when ions of high concentration are implanted therein.

Then, ions of high concentration are implanted into the semiconductor material layer, and an ion heavily doped region 10 is formed at the hollowed-out region of the low temperature polysilicon island 2, as shown in FIG. 8. The top view of FIG. 8 is the same as FIG. 7b. Here, ions of N-type being implanted therein is taken as an example, while the present disclosure is not limited by this. The ion heavily doped region 10 is used for forming the source and the drain of the thin film transistor.

Figure 9A:
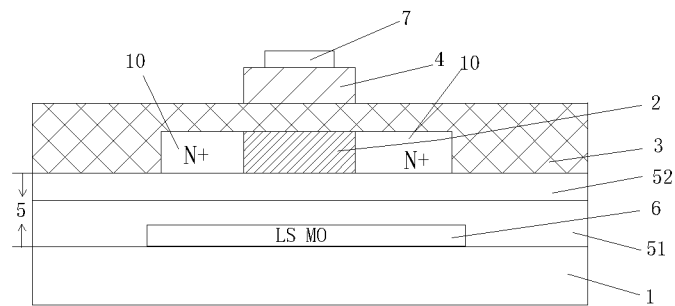
FIG. 9a is a sectional view of the substrate as shown in FIG. 8 after a wing part is removed therefrom.
Figure 9B:
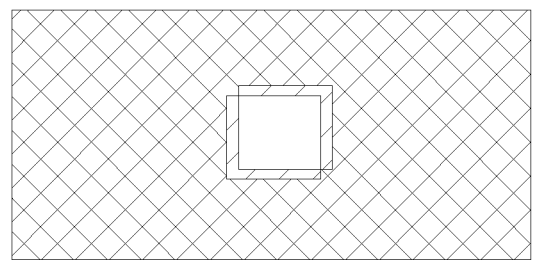

In the following, the wing part 72 of the photoresist layer 7 is removed, and the gate metal layer which is originally covered by the wing part is bare. Since the thickness of the photoresist material of the central part 71 of the photoresist layer 7 is larger than the thickness of the photoresist material of the wing part 72 of the photoresist layer 7, after the wing part 72 is removed, the photoresist material of the central part 71 is partly retained, and the thickness thereof is reduced, as shown in FIG. 9a. The top view of FIG. 9a is shown in FIG. 9b.

Figure 10A:
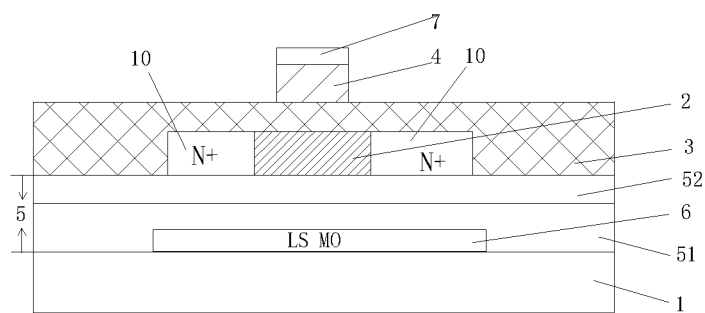
FIG. 10a is a sectional view of the substrate as shown in FIG. 9a after a gate metal layer that is not covered by the photoresist layer is removed therefrom.
Figure 10B:
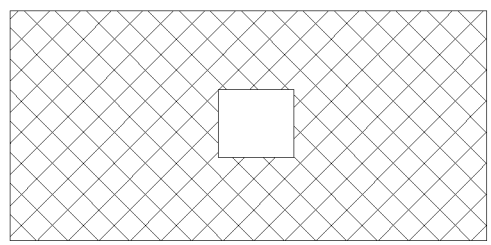

Next, the metal material of the gate metal layer 4 which is not covered by the photoresist material, i.e., the metal material of the gate metal layer 4 corresponding to the original wing part 72 of the photoresist layer 7, is removed. The sectional view of the baseplate after the metal material corresponding to the original wing part 72 is removed is shown in FIG. 10a, and the top view thereof is shown in FIG. 10b.

Figure 11:
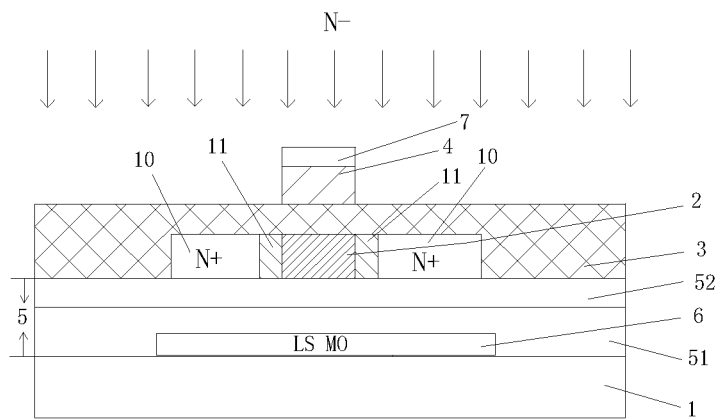
FIG. 11 is a sectional view of the substrate as shown in FIG. 10a when ions of low concentration are implanted therein.

After that, ions of low concentration are implanted into the semiconductor material layer, and an ion lightly doped region 11 is formed at a region of the low temperature polysilicon island 2 corresponding to the original wing part 72 of the photoresist layer 7, as shown in FIG. 11. The top view of FIG. 11 is the same as FIG. 10b. The ion lightly doped region 11 is used for forming the LDD region.

Figure 12A:
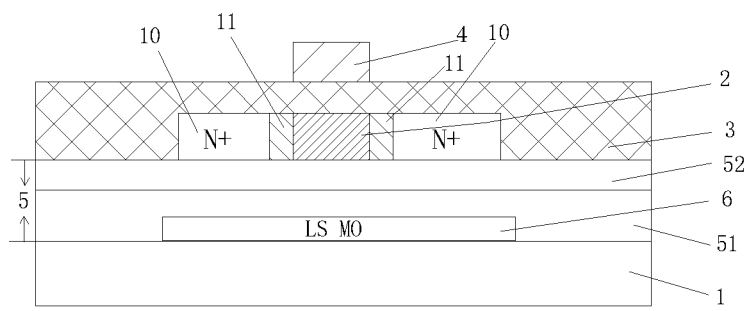
FIG. 12a is a sectional view of the substrate as shown in FIG. 11 after a residual photoresist layer is removed therefrom.
Figure 12B:
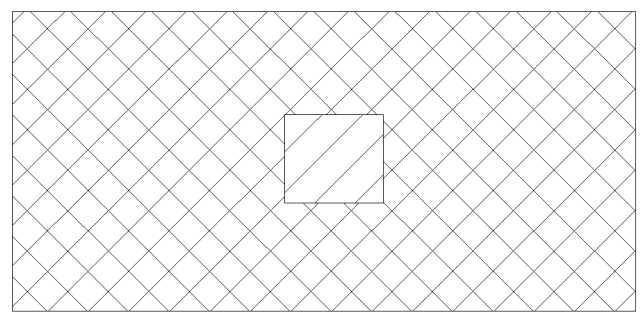

At last, the residual photoresist material of the gate metal layer 4 is etched away, and the gate metal layer which is originally covered by the photoresist material is bare. This part of gate metal layer corresponds to a gate, as shown in FIG. 12a. The top view of FIG. 12a is shown in FIG. 12b. Till now, the thin film transistor with a gate, a source, and a drain is obtained.

Figure 13:
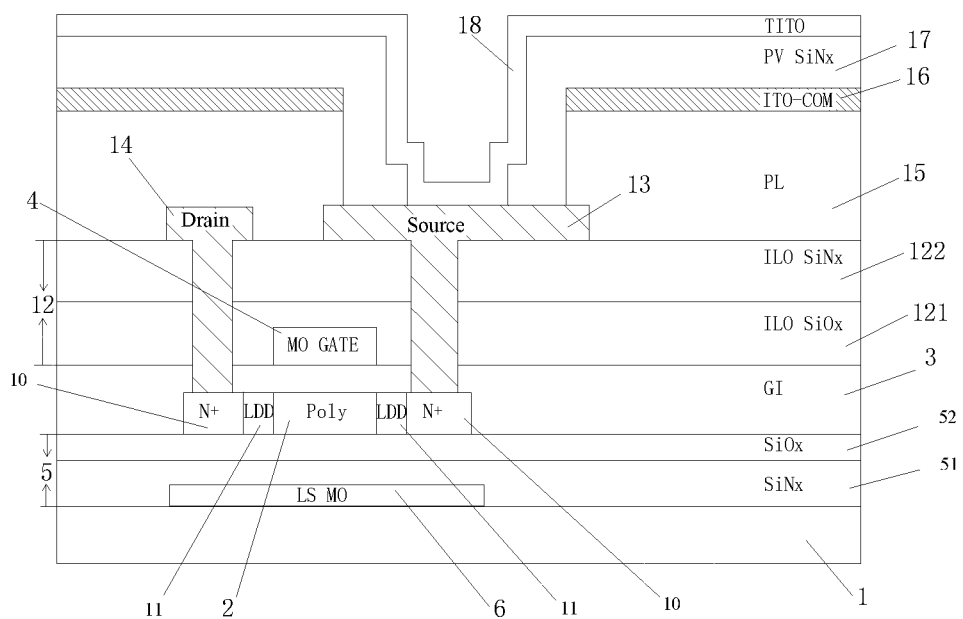
FIG. 13 is a sectional view of a LTPS display panel according to the embodiment of the present disclosure.

In general, when the polysilicon thin film transistor is used in a display panel, after the gate is formed on the gate insulation layer 3, silicon nitride and silicon oxide are deposited on the gate insulation layer 3 and the gate through PECVD technology so as to form an interlayer insulation layer. Then, thermal annealing and hydrogenation are performed on the interlayer insulation layer, whereby the doped ions can be activated and the low temperature polysilicon interface can be improved. Next, the interlayer insulation layer and the gate insulation layer are etched so as to form a contact hole, which extends to the ion heavily doped region. In the following, the source and drain metal layer is deposited, and the source and the drain are formed. After that, an organic flattening layer is manufactured on the source and drain metal layer, and a through hole is formed at a position of the contact hole. Subsequently, a bottom indium tin oxide layer is formed on the organic flattening layer to serve as a common electrode. At last, a passivation layer is formed on the organic flattening layer, and a contact hole is formed on the passivation layer and extends to the drain. The baseplate is coated with a transparent conductive material, and a pixel electrode which is electrically connected with the drain is formed after photolithography, etching, stripping and other procedures. The sectional view of the display panel formed thereby is shown in FIG. 13. The display panel comprises the baseplate 1, the light shielding layer 6, the buffer layer 5 which comprises the silicon nitride 51 and the silicon oxide 52, the low temperature polysilicon island 2, the ion heavily doped region 10, the ion lightly doped region 11, the gate 4, the gate insulation layer 3, the interlayer insulation layer 12 which comprises a silicon oxide layer 121 and a silicon nitride 122, the source 13, the drain 14, the organic flattening layer 15, the common electrode 16, the passivation layer 17 and the pixel electrode 18.

According to the present disclosure, when the LTPS panel is manufactured, the ion heavily doped region and the ion lightly doped region can be formed with only one photomask, whereby the manufacturing procedures and costs of the LTPS panel can be reduced.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for manufacturing polysilicon TFT, comprising the following steps:
    forming a semiconductor material layer on a prefabricated substrate;
    forming an intermediate layer on said semiconductor material layer;
    coating said intermediate layer with a photoresist material to form a photoresist layer, and exposing said photoresist layer with a photomask for a first time;
    moving the prefabricated substrate which has the photoresist layer treated by a first exposing treatment in a predetermined direction relative to said photomask, and exposing said photoresist layer with said photomask for a second time;
    removing an exposed photoresist material from said photoresist layer, so as to form a photoresist region and a hollowed-out region on said photoresist layer, wherein said photoresist region comprises a central part and a wing part, and said hollowed-out region contains no photoresist material; and
    forming an ion lightly doped region corresponding to said wing part and an ion heavily doped region corresponding to said hollowed-out region in said semiconductor material layer, said ion heavily doped region being used for forming a source and a drain.

2. The method according to claim 1, wherein said photomask comprises an opaque region and a non-opaque region.

3. The method according to claim 2, wherein when said prefabricated substrate is moved in the predetermined direction, said predetermined direction and a moving distance are selected in combination with each other so that the opaque region of said photomask covers a first part of an exposed region of said photoresist layer and a second part of an unexposed region of said photoresist layer.

4. The method according to claim 3, wherein said first part has the same width as the ion lightly doped region to be formed.

5. The method according to claim 4, wherein the central part of said photoresist region is formed by a part of the photoresist layer suffering no exposure during two times of exposing treatment, and the wing part of said photoresist region is formed by a part of the photoresist layer which is exposed only once during two times of exposing treatment.

6. The method according to claim 1, wherein said prefabricated substrate comprises a gate metal layer and a gate insulation layer that is arranged on said gate metal layer, and said intermediate layer is an interlayer insulation layer.

7. The method according to claim 1, wherein said intermediate layer comprises a gate insulation layer and a gate metal layer that is arranged on said gate insulation layer and used for forming a gate.

8. The method according to claim 7, wherein said photomask comprises an opaque region and a non-opaque region.

9. The method according to claim 8, wherein when said prefabricated substrate is moved in the predetermined direction, said predetermined direction and a moving distance are selected in combination with each other so that the opaque region of said photomask covers a first part of an exposed region of said photoresist layer and a second part of an unexposed region of said photoresist layer.

10. The method according to claim 9, wherein said first part has the same width as the ion lightly doped region to be formed.

11. The method according to claim 10, wherein the central part of said photoresist region is formed by a part of the photoresist layer suffering no exposure during two times of exposing treatment, and the wing part of said photoresist region is formed by a part of the photoresist layer which is exposed only once during two times of exposing treatment.

12. The method according to claim 7, wherein the steps of forming said ion lightly doped region and said ion heavily doped region comprise:
    removing a metal material of said gate metal layer corresponding to said hollowed-out region;
    implanting ions of high concentration so as to form said ion heavily doped region corresponding to said hollowed-out region in said semiconductor material layer;
    removing the wing part of said photoresist region, so that said gate metal layer is bare;
    etching away a bare region of the gate metal layer; and
    implanting ions of low concentration so as to form said ion lightly doped region corresponding to a removed wing part in said semiconductor material layer.

13. The method according to claim 12, further comprising forming a buffer layer on said prefabricated substrate before said semiconductor material layer is formed.

14. The method according to claim 13, further comprising forming an light shielding layer on said prefabricated substrate corresponding to said semiconductor material layer before said buffer layer is formed.

15. The method according to claim 9, wherein the steps of forming said ion lightly doped region and said ion heavily doped region comprise:
    removing a metal material of said gate metal layer corresponding to said hollowed-out region;

implanting ions of high concentration so as to form said ion heavily doped region corresponding to said hollowed-out region in said semiconductor material layer;

removing the wing part of said photoresist region, so that said gate metal layer is bare;

etching away a bare region of the gate metal layer; and implanting ions of low concentration so as to form said ion lightly doped region corresponding to a removed wing part in said semiconductor material layer.

16. The method according to claim 15, further comprising forming a buffer layer on said prefabricated substrate before said semiconductor material layer is formed.

17. The method according to claim 16, further comprising forming an light shielding layer on said prefabricated substrate corresponding to said semiconductor material layer before said buffer layer is formed.

18. The method according to claim 11, wherein the steps of forming said ion lightly doped region and said ion heavily doped region comprise:

removing a metal material of said gate metal layer corresponding to said hollowed-out region;

implanting ions of high concentration so as to form said ion heavily doped region corresponding to said hollowed-out region in said semiconductor material layer;

removing the wing part of said photoresist region, so that said gate metal layer is bare;

etching away a bare region of the gate metal layer; and implanting ions of low concentration so as to form said ion lightly doped region corresponding to a removed wing part in said semiconductor material layer.

19. The method according to claim 18, further comprising forming a buffer layer on said prefabricated substrate before said semiconductor material layer is formed.

20. The method according to claim 19, further comprising forming an light shielding layer on said prefabricated substrate corresponding to said semiconductor material layer before said buffer layer is formed.

* * * * *